(12) United States Patent
Saito et al.

(10) Patent No.: US 9,391,142 B2
(45) Date of Patent: Jul. 12, 2016

(54) SEMICONDUCTOR DEVICE

(71) Applicant: Kabushiki Kaisha Toshiba, Minato-ku, Tokyo (JP)

(72) Inventors: Wataru Saito, Kawasaki Kanagawa (JP); Yasunobu Saito, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/488,649

(22) Filed: Sep. 17, 2014

(65) Prior Publication Data
US 2015/0263104 A1    Sep. 17, 2015

(30) Foreign Application Priority Data
Mar. 11, 2014  (JP) .................................. 2014-047694

(51) Int. Cl.
*H01L 29/778*    (2006.01)
*H01L 29/20*     (2006.01)
(Continued)

(52) U.S. Cl.
CPC .......... *H01L 29/1066* (2013.01); *H01L 29/423* (2013.01); *H01L 29/7786* (2013.01);
(Continued)

(58) Field of Classification Search
CPC .................. H01L 29/205; H01L 2924/10344; H01L 29/1066
USPC ....................................................... 257/211
See application file for complete search history.

(56) References Cited

U.S. PATENT DOCUMENTS 7,663,161 B2 * 2/2010 Kaibara .............. H01L 29/1066 257/183
7,898,002 B2 * 3/2011 Hikita ................. H01L 29/1066 257/192

(Continued)

FOREIGN PATENT DOCUMENTS

JP    2005-244072 A    9/2005
JP    2006-073802 A    3/2006

(Continued)

OTHER PUBLICATIONS

Korean Office Action issued in Korean Patent Application No. 10-2014-0093170 dated Oct. 27, 2015, with English Translation.

(Continued)

*Primary Examiner* — Moazzam Hossain
(74) *Attorney, Agent, or Firm* — White & Case LLP

(57) ABSTRACT

A semiconductor device of this embodiment includes: a first semiconductor layer including $Al_XGa_{1-X}N$; a second semiconductor layer provided above the first semiconductor layer, and including undoped or n-type $Al_YGa_{1-Y}N$; a first and second electrodes provided above the second semiconductor layer; a third semiconductor layer provided above the second semiconductor layer between the first electrode and the second electrode, is at a distance from each of the first and second electrodes, and including p-type $Al_ZGa_{1-Z}N$; a control electrode provided above the third semiconductor layer; a fourth semiconductor layer provided above the third semiconductor layer between the first electrode and the control electrode, is at a distance from the control electrode, and including n-type $Al_UGa_{1-U}N$; and a fifth semiconductor layer provided above a portion of the third semiconductor layer between the control electrode and the second electrode, is at a distance from the control electrode, and including n-type $Al_UGa_{1-U}N$.

6 Claims, 8 Drawing Sheets

(51) Int. Cl.
*H01L 29/205* (2006.01)
*H01L 29/10* (2006.01)
*H01L 29/423* (2006.01)
H01L 29/40 (2006.01)
H01L 29/417 (2006.01)
H01L 29/06 (2006.01)

(52) U.S. Cl.
CPC ......... *H01L29/0657* (2013.01); *H01L 29/2003* (2013.01); *H01L 29/402* (2013.01); *H01L 29/41766* (2013.01); *H01L 29/42316* (2013.01)

(56) References Cited

U.S. PATENT DOCUMENTS

| | | | | |
|---|---|---|---|---|
| 8,304,811 | B2* | 11/2012 | Zhang | H01L 29/42316 257/194 |
| 8,357,602 | B2 | 1/2013 | Kanamura et al. | |
| 8,994,035 | B2* | 3/2015 | Simin | G06F 17/5068 257/192 |
| 2004/0061129 | A1* | 4/2004 | Saxler | H01L 29/7787 257/192 |
| 2005/0189559 | A1 | 9/2005 | Saito et al. | |
| 2006/0043501 | A1 | 3/2006 | Saito et al. | |
| 2007/0176215 | A1 | 8/2007 | Yanagihara et al. | |
| 2009/0072272 | A1* | 3/2009 | Suh | H01L 29/1066 257/194 |
| 2009/0146185 | A1* | 6/2009 | Suh | H01L 29/2003 257/194 |
| 2010/0140664 | A1* | 6/2010 | Sheppard | H01L 29/7787 257/194 |
| 2011/0012173 | A1 | 1/2011 | Umeda et al. | |
| 2011/0089468 | A1* | 4/2011 | Zhang | H01L 29/42316 257/194 |
| 2011/0227093 | A1 | 9/2011 | Hikita et al. | |
| 2011/0272708 | A1 | 11/2011 | Yoshioka et al. | |
| 2011/0284928 | A1 | 11/2011 | Shibata et al. | |
| 2012/0228674 | A1* | 9/2012 | Okamoto | H01L 29/1054 257/192 |
| 2013/0069175 | A1 | 3/2013 | Ozaki et al. | |
| 2013/0083567 | A1 | 4/2013 | Imada | |
| 2013/0292699 | A1 | 11/2013 | Ueno et al. | |
| 2014/0097433 | A1* | 4/2014 | Negoro | H01L 29/66462 257/51 |
| 2015/0325689 | A1* | 11/2015 | Takeya | H01L 29/66462 257/76 |

FOREIGN PATENT DOCUMENTS

| | | |
|---|---|---|
| JP | 2007-201279 A | 8/2007 |
| JP | 2009-049288 A | 3/2009 |
| JP | 2009-231508 A | 10/2009 |
| JP | 2010-135641 A | 6/2010 |
| JP | 2010-186925 A | 8/2010 |
| JP | 2011-082216 A | 4/2011 |
| JP | 2011-238654 A | 11/2011 |
| JP | 2011-243978 A | 12/2011 |
| JP | 2013-074280 A | 4/2013 |
| TW | 201318164 A | 5/2013 |

OTHER PUBLICATIONS

Taiwanese Office Action issued on Dec. 8, 2015 in corresponding Taiwanese Application No. 103125157, along with English translation thereof.

* cited by examiner

US 9,391,142 B2

SEMICONDUCTOR DEVICE

CROSS-REFERENCE TO RELATED APPLICATION

This application is based upon and claims the benefit of priority from Japanese Patent Application No. 2014-047694, filed on Mar. 11, 2014, the entire contents of which are incorporated herein by reference.

FIELD

Embodiments described herein relate generally to a semiconductor device.

BACKGROUND

Power semiconductor devices such as switching devices and diodes are used in the circuits of switching power supplies, inverters, and the like. Those power semiconductor devices are required to have high breakdown voltage and low on-state resistance. The relationship between breakdown voltage and on-state resistance is a trade-off relationship determined by device materials.

As technological development has progressed, the on-state resistance of power semiconductor devices has become close to the limit of silicon, which is a principal device material. So as to lower the on-state resistance further, a change of device materials is necessary. By using a nitride semiconductor like GaN or AlGaN, or a wide bandgap semiconductor like silicon carbide (SiC) as the switching device material, the trade-off relationship determined by materials can be improved, and the on-state resistance can be dramatically lowered.

An example of a device that uses a nitride semiconductor such as GaN or AlGaN and easily achieves low on-state resistance is a heterojunction field effect transistor (HFET) that uses an AlGaN/GaN heterostructure. This HFET realizes low on-state resistance with the high mobility of a heterointerface channel and the high concentration of electrons generated through polarization. Accordingly, low on-state resistance is achieved, even if the chip area of the device is small.

However, as the HFET generates electrons through polarization, electrons also exist at a high concentration under the gate electrode. Therefore, the HFET is a normally-on device that generally has a negative gate threshold voltage. For safe operation, a power semiconductor device is preferably a normally-off device that has a positive gate threshold voltage. So as to realize a normally-off device, the concentration of electrons under the gate electrode needs to be selectively limited to zero.

DETAILED DESCRIPTION

Figure 1:
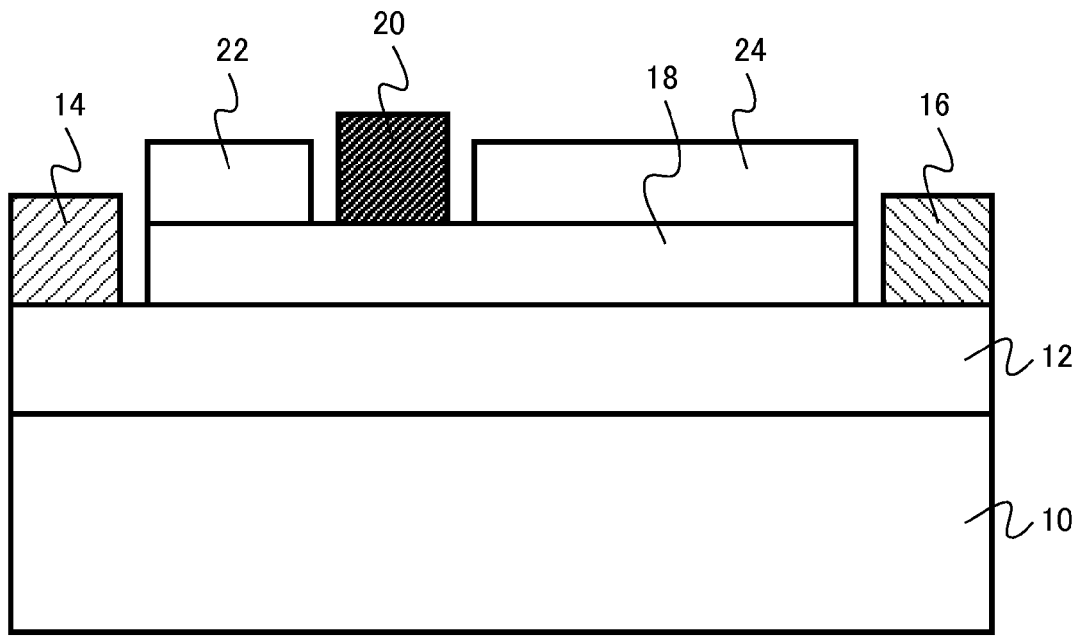
FIG. 1 is a schematic cross-sectional view of a semiconductor device of a first embodiment.

A semiconductor device of one embodiment includes: a first semiconductor layer including $Al_XGa_{1-X}N$ ($0 \leq X < 1$); a second semiconductor layer provided above the first semiconductor layer, the second semiconductor layer including undoped or n-type $Al_YGa_{1-Y}N$ ($0 < Y \leq 1$, $X < Y$); a first electrode provided above the second semiconductor layer; a second electrode provided above the second semiconductor layer; a third semiconductor layer provided above a portion of the second semiconductor layer between the first electrode and the second electrode, the third semiconductor layer being at a distance from each of the first electrode and the second electrode, the third semiconductor layer including p-type $Al_ZGa_{1-Z}N$ ($0 \leq Z < 1$); a control electrode provided above the third semiconductor layer; a fourth semiconductor layer provided above a portion of the third semiconductor layer between the first electrode and the control electrode, the fourth semiconductor layer being at a distance from the control electrode, the fourth semiconductor layer including n-type $Al_UGa_{1-U}N$ ($0 \leq U < 1$); and a fifth semiconductor layer provided above a portion of the third semiconductor layer between the control electrode and the second electrode, the fifth semiconductor layer being at a distance from the control electrode, the fifth semiconductor layer including n-type $Al_UGa_{1-U}N$ ($0 \leq U < 1$).

In this specification, like or similar components are denoted by like reference numerals, and, in some cases, explanation of a component that has already described will not be repeated again.

The term "undoped" used in this specification refers to no intentional introduction of impurities.

The phrase "made of $Al_XGa_{1-X}N$ ($0 \leq X < 1$)" used in this specification does not refer to total exclusion of materials or impurities other than "$Al_XGa_{1-X}N$ ($0 \leq X < 1$)".

First Embodiment

A semiconductor device of this embodiment includes: a first semiconductor layer made of $Al_XGa_{1-X}N$ ($0 \leq X < 1$); a second semiconductor layer that is provided above the first semiconductor layer, and is made of undoped or n-type $Al_YGa_{1-Y}N$ ($0 < Y \leq 1$, $X < Y$); a first electrode provided above the second semiconductor layer; a second electrode provided above the second semiconductor layer; a third semiconductor layer that is provided above a portion of the second semiconductor layer between the first electrode and the second electrode, is at a distance from each of the first electrode and the second electrode, and is made of p-type $Al_ZGa_{1-Z}N$ ($0 \leq Z < 1$);

a control electrode provided above the third semiconductor layer; a fourth semiconductor layer that is provided above a portion of the third semiconductor layer between the first electrode and the control electrode, is at a distance from the control electrode, and is made of n-type $Al_U Ga_{1-U}N$ ($0 \le U<1$); and a fifth semiconductor layer that is provided above a portion of the third semiconductor layer between the control electrode and the second electrode, is at a distance from the control electrode, and is made of n-type $Al_U Ga_{1-U}N$ ($0 \le U<1$).

FIG. 1 is a schematic cross-sectional view of the semiconductor device of this embodiment. The semiconductor device of this embodiment is a HFET.

As shown in FIG. 1, a barrier layer (the second semiconductor layer) 12 is provided on a channel layer (the first semiconductor layer) 10. A source electrode (the first electrode) 14 and a drain electrode (the second electrode) 16 are provided on the barrier layer (the second semiconductor layer) 12.

A p-type cap layer (the third semiconductor layer) 18 is placed between the source electrode 14 and the drain electrode 16 on the barrier layer 12. The p-type cap layer 18 is located at a distance from the source electrode 14 and the drain electrode 16. That is, the p-type cap layer 18 is neither physically nor electrically connected to the source electrode 14 and the drain electrode 16.

A gate electrode (the control electrode) 20 is provided on the p-type cap layer 18. A first n-type cap layer (the fourth semiconductor layer) 22 is provided on a portion of the p-type cap layer 18, the portion being located between the source electrode 14 and the gate electrode 20. A second n-type cap layer (the fifth semiconductor layer) 24 is further provided on a portion of the p-type cap layer 18, the portion being located between the gate electrode 20 and the drain electrode 16.

The source electrode 14 and the drain electrode 16 are formed as strip-shaped (or line-shaped) electrodes that are parallel to each other on the surface of the barrier layer 12, for example. The gate electrode 20 is then formed as a strip-shaped electrode that is parallel to the source electrode 14 and the drain electrode 16, on the surface of the p-type cap layer 18 between the source electrode 14 and the drain electrode 16.

The channel layer (the first semiconductor layer) 10 is made of undoped $Al_X Ga_{1-X}N$ ($0 \le X<1$). For example, the channel layer 10 is undoped GaN. The channel layer 10 may also contain an n-type or p-type impurity.

The barrier layer (the second semiconductor layer) 12 is made of undoped or n-type $Al_Y Ga_{1-Y}N$ ($0<Y \le 1$, $X<Y$). The barrier layer 12 is undoped $Al_{0.25}Ga_{0.75}N$, for example. The aluminum (Al) concentration in the barrier layer 12 is higher than that in the channel layer 10.

The source electrode (the first electrode) 14 and the drain electrode 16 are metal electrodes. The source electrode (the first electrode) 14 and the drain electrode 16 have aluminum (Al) as a principal component, for example. Ohmic contacts are preferably formed between the barrier layer 12 and the source and drain electrodes 14 and 16.

The gate electrode (the control electrode) 20 is a metal electrode, for example. The gate electrode 20 is platinum (Pt) or titanium nitride (TiN), for example. An ohmic contact is preferably formed between the gate electrode 20 and the p-type cap layer 18.

The p-type cap layer (the third semiconductor layer) 18 is made of p-type $Al_Z Ga_{1-Z}N$ ($0 \le Z<1$). The p-type cap layer 18 is p-type GaN containing Mg (magnesium) as the p-type impurity, for example.

The first n-type cap layer (the fourth semiconductor layer) 22 and the second n-type cap layer (the fifth semiconductor layer) 24 are made of n-type $Al_U Ga_{1-U}N$ ($0 \le U<1$). The first n-type cap layer 22 and the second n-type cap layer 24 have the same chemical compositions. The first n-type cap layer 22 and the second n-type cap layer 24 are n-type GaN containing Si (silicon) as the n-type impurity, for example.

Next, an example of a method of manufacturing the semiconductor device of this embodiment is described. A supporting substrate (not shown), such as a Si substrate, is prepared. An undoped GaN film to be the channel layer 10, an undoped $Al_{0.25}Ga_{0.75}N$ film to be the barrier layer 12, a p-type GaN film to be the p-type cap layer 18, and an n-type GaN film to be the first n-type cap layer 22 and the second n-type cap layer 24 are formed on the Si substrate by epitaxial growth, for example.

Etching is then performed on the p-type GaN film and the n-type GaN film, to expose part of the undoped $Al_{0.25}Ga_{0.75}N$. The source electrode 14 and the drain electrode 16 are then formed on the exposed portion of the undoped $Al_{0.25}Ga_{0.75}N$ by forming and patterning a metal film.

After that, etching is performed on a portion of the n-type GaN film located between the source electrode 14 and the drain electrode 16, to expose part of the p-type GaN film. Through this etching, the first n-type cap layer (the fourth semiconductor layer) 22 and the second n-type cap layer (the fifth semiconductor layer) 24 are formed. The gate electrode 20 is then formed on the exposed portion of the p-type GaN film by forming and patterning a metal film.

By the above described manufacturing method, the semiconductor device shown in FIG. 1 is manufactured.

Next, the action and effects of the semiconductor device of this embodiment are described.

In the HFET of this embodiment, the p-type cap layer 18 exists immediately below the gate electrode 20. Therefore, the polarization of the barrier layer 12 is weakened, and a built-in potential is generated. As a result, the barrier layer 12 and the channel layer 10 are depleted. Accordingly, generation of a two-dimensional electron gas is suppressed in the heterointerface between the channel layer 10 and the barrier layer 12. Thus, a HFET of normally-off operation is realized.

Meanwhile, between the gate electrode 20 and the source and drain electrodes 14 and 16, the first n-type cap layer 22 and the second n-type cap layer 24 are formed on the p-type cap layer 18. As a depletion layer extends in the first n-type cap layer 22 and the second n-type cap layer 24, influence of the built-in potential of the p-type cap layer 18 on the barrier layer 12 and the channel layer 10 is reduced. As a result, a two-dimensional electron gas is generated in the heterointerface between the channel layer 10 and the barrier layer 12. Thus, a HFET with low on-state resistance is realized.

In this embodiment, the p-type cap layer 18 is located at a distance from the source electrode 14 and the drain electrode 16. Accordingly, current leakage between the gate electrode 20 and the source and drain electrodes 14 and 16 is suppressed. Thus, a HFET that consumes less power is realized.

For example, the p-type cap layer 18 may be selectively formed only immediately below the gate electrode 20, to realize a HFET of normally-off operation with low on-state resistance. By this method, however, etching needs to be performed to remove the portions of the p-type cap layer 18 located between the gate electrode 20 and the source and drain electrodes 14 and 16.

At the time of the etching of the p-type cap layer 18, the surface of the barrier layer 12 under the p-type cap layer 18 is subjected to the etching, and etching damage might be caused. Also, there is a risk that the exposed surface of the barrier layer 12 is oxidized.

When process damage such as etching damage and oxidation is caused in the surface of the barrier layer 12, a level (or trap level) appears in the interface between the barrier layer 12 and the passivation film. As carriers are trapped in this level, a current collapse that is a transient increase in on-state resistance, or reliability degradation occurs.

In this embodiment, the first n-type cap layer 22 and the second n-type cap layer 24 do not exist between the gate electrode 20 and the source and drain electrodes 14 and 16, and the surface of the barrier layer 12 is not exposed. Furthermore, the first n-type cap layer 22 and the second n-type cap layer 24 are not subjected to etching. As a result, generation of levels in the barrier layer 12 and the interfaces between the passivation film and the first and second n-type cap layers 22 and 24 is suppressed. Accordingly, trapping of carriers in the interface between the semiconductor layer and the passivation film is suppressed. Thus, current collapses and reliability degradation are suppressed.

As described above, this embodiment provides a HFET that realizes normally-off operation, low on-state resistance, low power consumption, a current collapse reduction, and reliability improvement.

In this embodiment, the sheet impurity concentration of the n-type impurity in the first n-type cap layer (the fourth semiconductor layer) 22 and the second n-type cap layer (the fifth semiconductor layer) 24 is preferably higher than the sheet impurity concentration of the p-type impurity in the p-type cap layer (the third semiconductor layer) 18. In this structure, depletion of the barrier layer 12 and the channel layer 10 is completely suppressed immediately below the portions of the p-type cap layer 18 located between the gate electrode 20 and the source and drain electrodes 14 and 16. Accordingly, lower on-state resistance is realized.

Sheet impurity concentrations can be calculated by measuring the amounts of impurities in semiconductor layers by SIMS (Secondary Ion Mass Spectrometry) analysis.

In this embodiment, the Al concentration in the first n-type cap layer (the fourth semiconductor layer) 22 and the second n-type cap layer (the fifth semiconductor layer) 24 is preferably higher than the Al concentration in the p-type cap layer (the third semiconductor layer) 18. Doping of Al into the first n-type cap layer 22 and the second n-type cap layer 24 is equivalent to doping of an n-type impurity. Accordingly, in this structure, depletion of the barrier layer 12 and the channel layer 10 can be suppressed.

In the regions corresponding to the first n-type cap layer (the fourth semiconductor layer) 22 and the second n-type cap layer (the fifth semiconductor layer) 24, semiconductor layers made of undoped $Al_SGa_{1-S}N$ (0<S<1), instead of n-type $Al_UGa_{1-U}N$ (0≤U<1), may be formed. In this structure, depletion of the barrier layer 12 and the channel layer 10 can also be suppressed by optimizing Al concentrations.

(First Modification)

Figure 2:
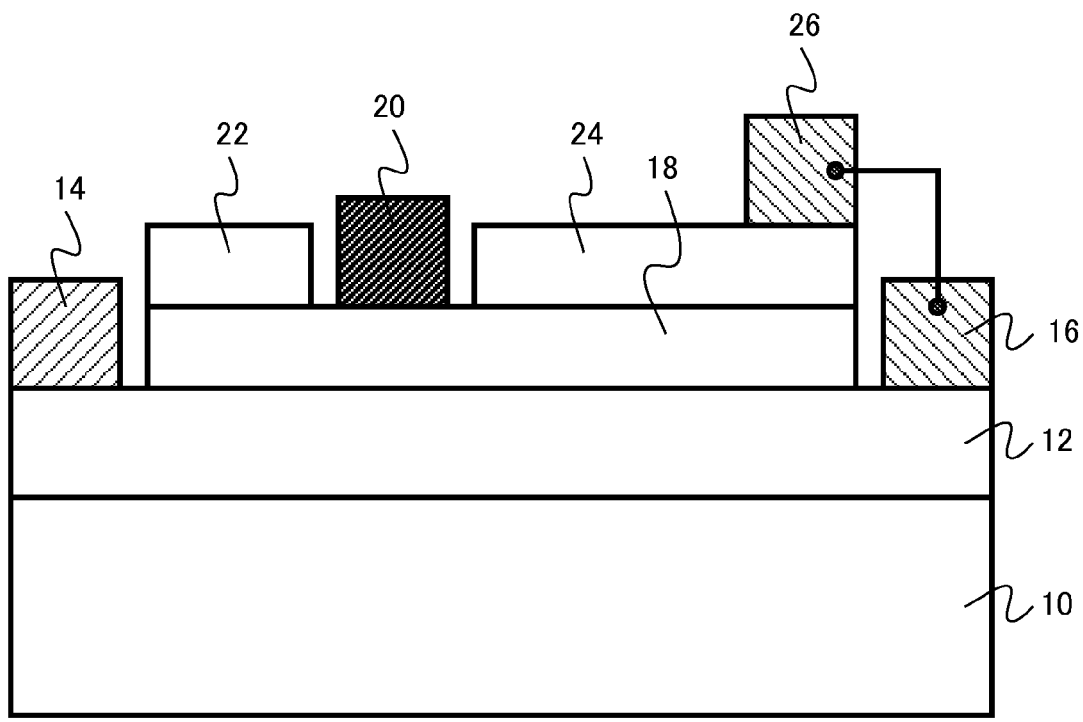
FIG. 2 is a schematic cross-sectional view of a semiconductor device as a first modification of the first embodiment.

FIG. 2 is a schematic cross-sectional view of a semiconductor device as a first modification of this embodiment. In this modification, the second n-type cap layer (the fifth semiconductor layer) 24 is electrically connected to the drain electrode (the second electrode) 16. Specifically, a strip-shaped electrode 26 is further provided on or above the second n-type cap layer 24, for example, and the electrode 26 is electrically connected to the drain electrode 16.

In FIG. 2, the solid line connecting the electrode 26 and the drain electrode 16 schematically shows that the electrode 26 is electrically connected to the drain electrode 16. In the other drawings of this specification, like solid lines schematically show electrical connections.

Any specific method of connecting the electrode 26 and the drain electrode 16 does not limit the structure thereof. For example, the respective end portions of the strips of the electrode 26 and the drain electrode 16 may be connected by using a metal interconnect formed as an upper layer.

According to this modification, electrons stored in the second n-type cap layer 24 can be promptly discharged into the drain electrode 16. Accordingly, operation of the HFET at the time of switching becomes stable.

In this modification, the sheet carrier concentration of the two-dimensional electron gas in the interface between the channel layer (the first semiconductor layer) 10 and the barrier layer (the second semiconductor layer) 12 located immediately below the second n-type cap layer (the fifth semiconductor layer) 24 is preferably lower than the sheet impurity concentration of the p-type impurity in the p-type cap layer (the third semiconductor layer) 18 and the sheet impurity concentration of the n-type impurity in the second n-type cap layer (the fifth semiconductor layer) 24. In this structure, avalanche breakdown caused by applying a high voltage to the drain electrode 16 while the HFET is off can be made to occur not in the channel layer 10 but in the p-type cap layer 18 and the second n-type cap layer 24.

Accordingly, electrons generated by avalanche breakdown can be promptly discharged into the drain electrode 16 via the electrode 26. Also, holes generated by avalanche breakdown can be promptly discharged into the gate electrode 20. Thus, the HFET can have higher resistance to avalanches.

The sheet carrier concentration of the two-dimensional electron gas can be calculated by determining the compositions of the channel layer (the first semiconductor layer) 10 and the barrier layer (the second semiconductor layer) 12 by SIMS analysis, determining the thickness of the barrier layer 12 by TEM (transmission Electron Microscope) analysis, and calculating a theoretical formula into which the determined compositions and thickness are plugged. A sheet impurity concentration can be calculated by measuring the amount of an impurity in a semiconductor layer by SIMS analysis.

(Second Modification)

Figure 3:
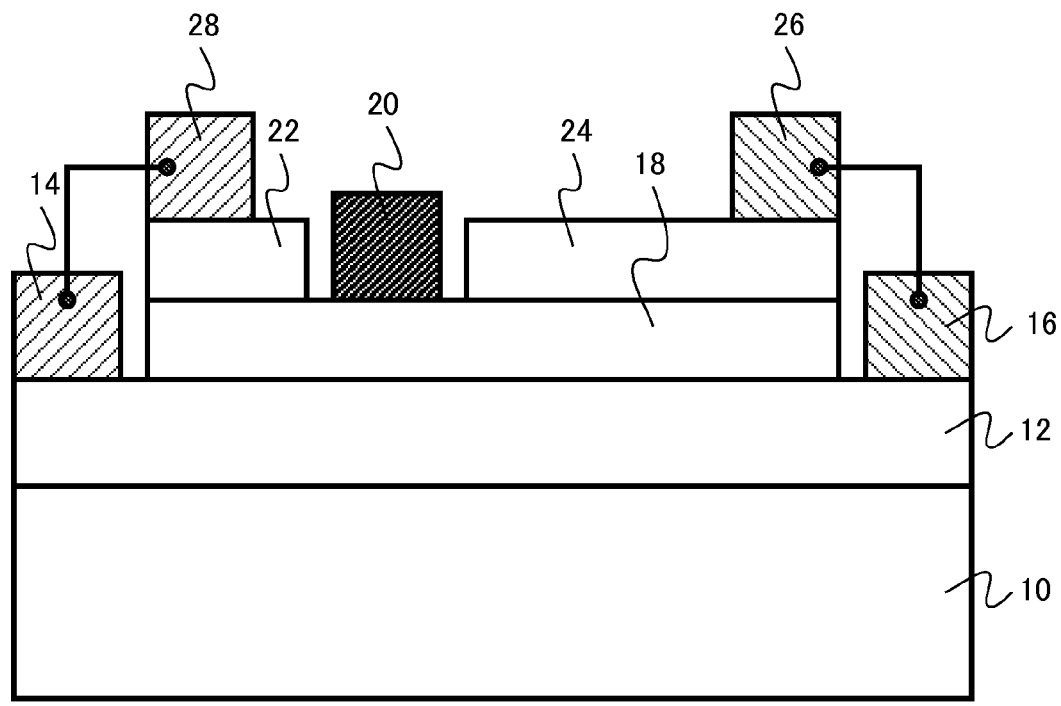
FIG. 3 is a schematic cross-sectional view of a semiconductor device as a second modification of the first embodiment.

FIG. 3 is a schematic cross-sectional view of a semiconductor device as a second modification of this embodiment. In this modification, the first n-type cap layer (the fourth semiconductor layer) 22 is electrically connected to the source electrode (the first electrode) 14. Specifically, a strip-shaped electrode 28 is further provided on or above the first n-type cap layer 22, for example, and the electrode 28 is electrically connected to the source electrode 14. This modification differs from the first modification in that the first n-type cap layer 22 is electrically connected to the source electrode 14.

According to this modification, carriers stored in the first n-type cap layer 22 can be promptly discharged into the source electrode 14. Accordingly, operation of the HFET at the time of switching becomes stable.

(Third Modification)

Figure 4:
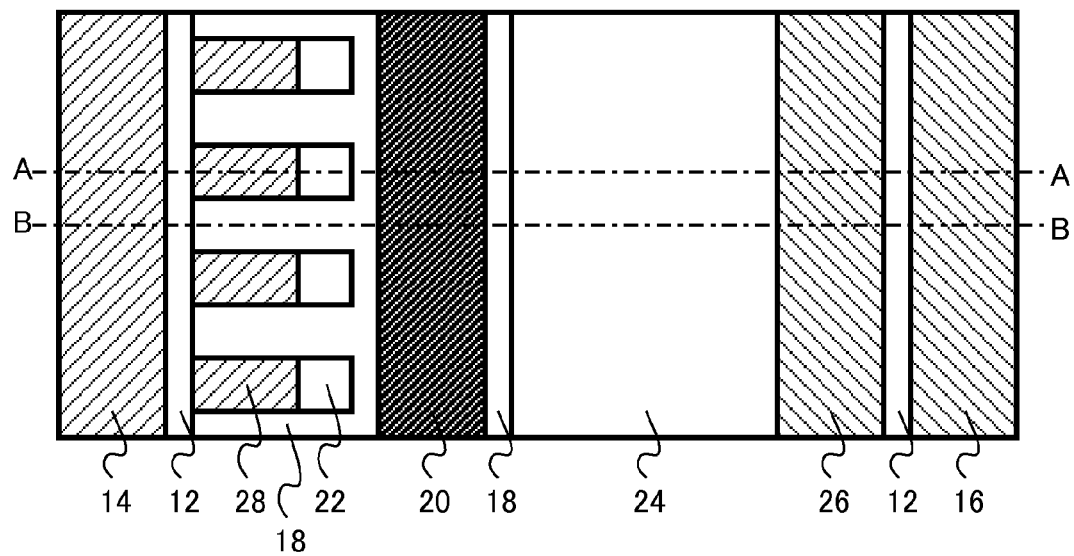
FIG. 4 is a top view of a semiconductor device as a third modification of the first embodiment.
Figure 5A:
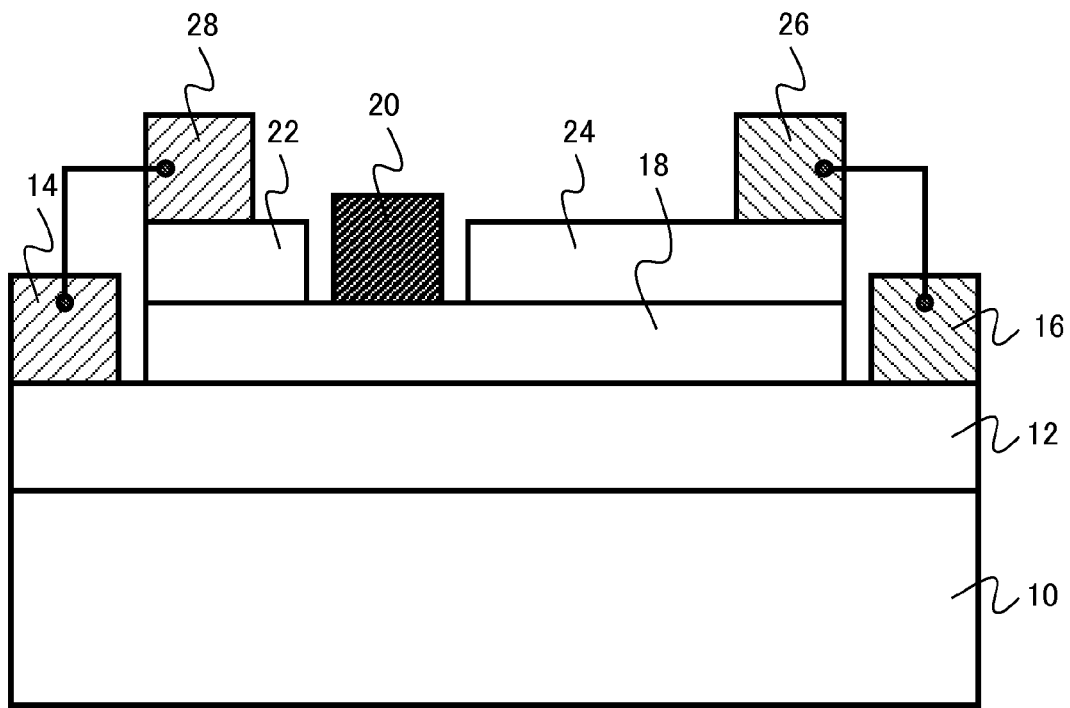
FIGS. 5A and 5B are schematic cross-sectional views of the semiconductor device as the third modification of the first embodiment.
Figure 5B:
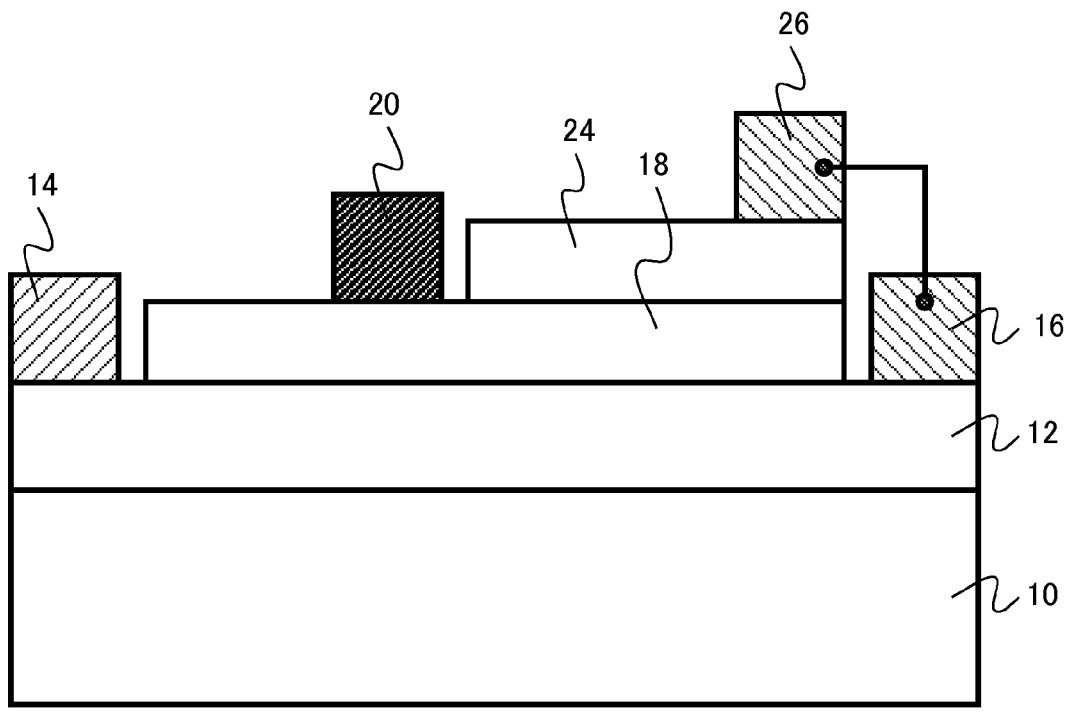

FIG. 4 is a schematic top view of a semiconductor device as a third modification of this embodiment. FIGS. 5A and 5B are schematic cross-sectional views of the semiconductor device as the third modification of this embodiment. FIG. 5A is a cross-sectional view taken along A-A defined in FIG. 4, and FIG. 5B is a cross-sectional view taken along B-B defined in FIG. 4.

This modification differs from the second modification in that the first n-type cap layer (the fourth semiconductor layer) 22 and the electrode 28 are provided in island-like forms.

In this modification, the first n-type cap layer 22 is selectively provided as island-like forms. In this structure, electrons do not exist immediately below the region where the first n-type cap layer 22 does not exist. As a result, the barrier against holes traveling from the drain electrode 16 to the source electrode 14 becomes lower. Accordingly, when avalanche breakdown occurs, generated holes can be promptly discharged into the source electrode 14. Thus, the HFET can have even higher resistance to avalanches.

Second Embodiment

A semiconductor device of this embodiment includes: a first semiconductor layer made of $Al_XGa_{1-X}N$ (0≤X<1); a second semiconductor layer that is provided on or above the first semiconductor layer, and is made of undoped or n-type $Al_YGa_{1-Y}N$ (0<Y≤1, X<Y); a first electrode provided on or above the second semiconductor layer; a second electrode provided on or above the second semiconductor layer; a third semiconductor layer that is provided on or above a portion of the second semiconductor layer between the first electrode and the second electrode, has a first groove and a second groove, and is made of p-type $Al_ZGa_{1-Z}N$ (0≤Z<1); a control electrode provided on or above a portion of the third semiconductor layer between the first groove and the second groove; a fourth semiconductor layer that is provided on or above a portion of the third semiconductor layer between the first electrode and the first groove, is at a distance from the control electrode, and is made of n-type $Al_UGa_{1-U}N$ (0≤U<1); and a fifth semiconductor layer that is provided on or above a portion of the third semiconductor layer between the second groove and the second electrode, is at a distance from the control electrode, and is made of n-type $Al_UGa_{1-U}N$ (0≤U<1).

The semiconductor device of this embodiment differs from the first embodiment in that the first groove and the second groove are formed in the third semiconductor layer, the first electrode and the fourth semiconductor layer are not necessarily at a distance from each other, and the second electrode and the fifth semiconductor layer are not necessarily at a distance from each other. In the description below, explanation of the same aspects of those of the first embodiment will not be repeated.

Figure 6:
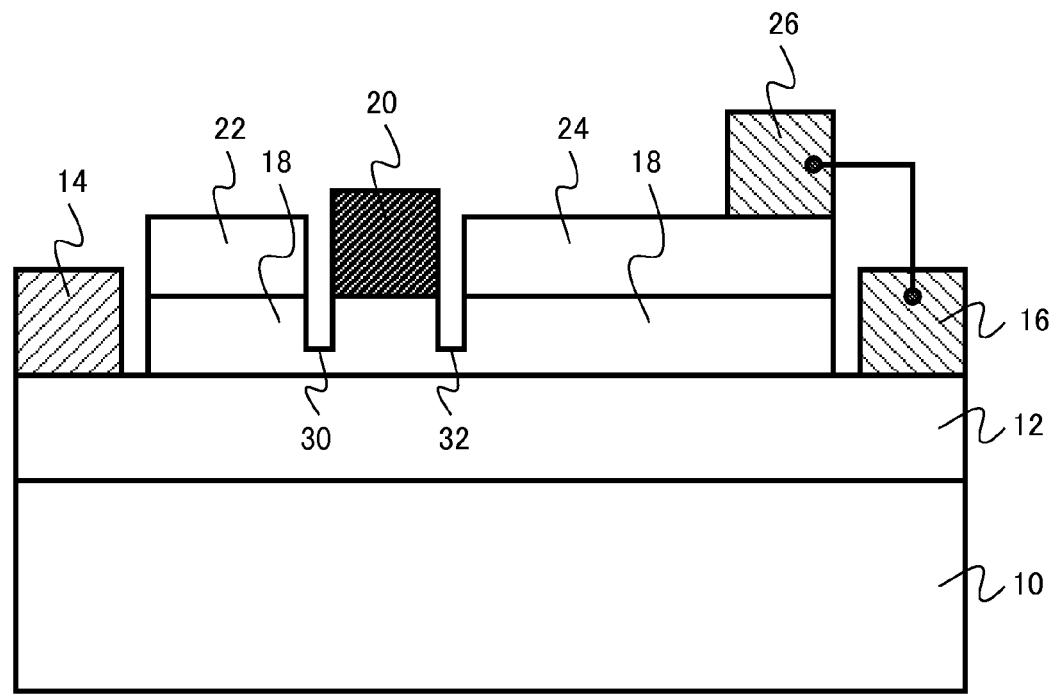
FIG. 6 is a schematic cross-sectional view of a semiconductor device of a second embodiment.

FIG. 6 is a schematic cross-sectional view of the semiconductor device of this embodiment. The semiconductor device of this embodiment is a HFET.

As shown in FIG. 6, a first groove 30 and a second groove 32 are formed in the p-type cap layer (the third semiconductor layer) 18. The gate electrode 20 is provided on or above the portion of the p-type cap layer 18 located between the first groove 30 and the second groove 32.

In other words, the first groove 30 and the second groove 32 are formed in portions of the p-type cap layer 18 located on both sides of the gate electrode 20. The bottom portions of the first groove 30 and the second groove 32 are located in the p-type cap layer 18.

The second n-type cap layer (the fifth semiconductor layer) 24 is electrically connected to the drain electrode (the second electrode) 16. Specifically, a strip-shaped electrode 26 is further provided on or above the second n-type cap layer 24, for example, and the electrode 26 is electrically connected to the drain electrode 16.

In FIG. 6, the p-type cap layer 18 is located at a distance from the source electrode 14 and the drain electrode 16. Alternatively, the p-type cap layer 18 may be connected to the source electrode 14 and the drain electrode 16.

In this embodiment, the first groove 30 and the second groove 32 are formed. Accordingly, when a gate voltage is applied to the gate electrode 20, carriers between the source electrode 14 and the gate electrode 20, and carriers between the gate electrode 20 and the drain electrode 16 are not easily modulated via the p-type cap layer 18. Meanwhile, the concentration of electrons immediately below the gate electrode 20 is efficiently modulated, and high mutual conductance is obtained. Also, gate capacitance becomes lower. Accordingly, high-speed switching operation becomes possible.

As described above, this embodiment provides a HFET that realizes normally-off operation, low on-state resistance, low power consumption, a current collapse reduction, and reliability improvement. This HFET further realizes high-speed switching operation.

(First Modification)

Figure 7:
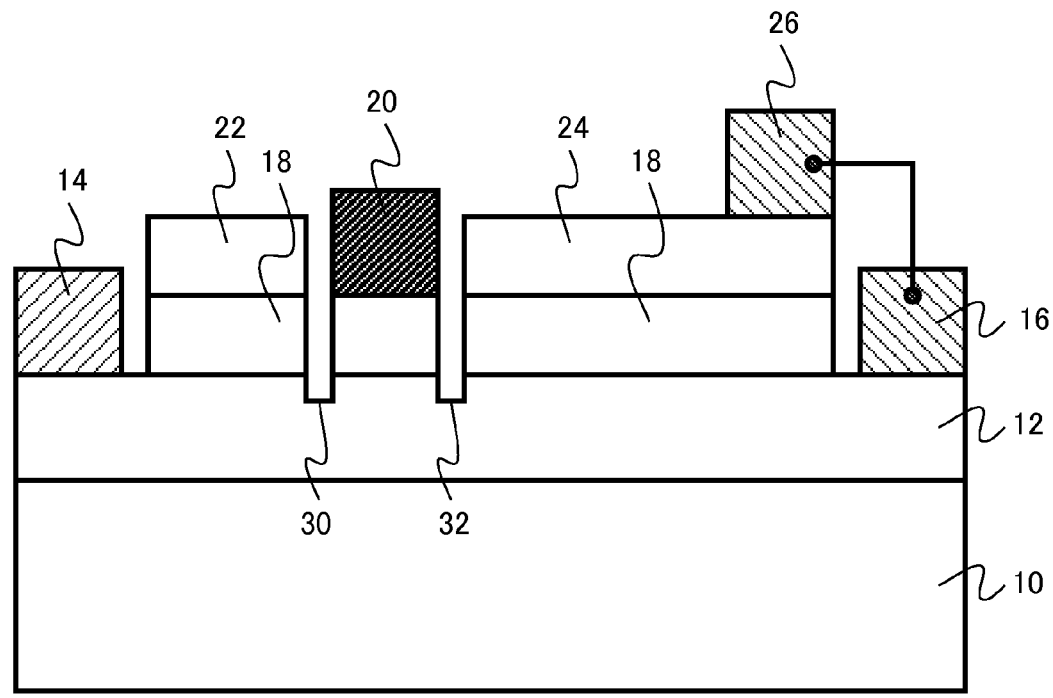
FIG. 7 is a schematic cross-sectional view of a semiconductor device as a first modification of the second embodiment.

FIG. 7 is a schematic cross-sectional view of a semiconductor device as a first modification of this embodiment. This modification differs from the second embodiment in that the bottom portions of the first groove 30 and the second groove 32 are located in the barrier layer (the second semiconductor layer) 12.

Compared with the second embodiment, this modification has a lower possibility that carriers between the source electrode 14 and the gate electrode 20, and carriers between the gate electrode 20 and the drain electrode 16 are modulated via the p-type cap layer 18 when a gate voltage is applied to the gate electrode 20. Meanwhile, the concentration of electrons immediately below the gate electrode 20 is more efficiently modulated, and high mutual conductance is obtained. Also, gate capacitance becomes even lower. Accordingly, higher-speed switching operation becomes possible.

(Second Modification)

Figure 8:
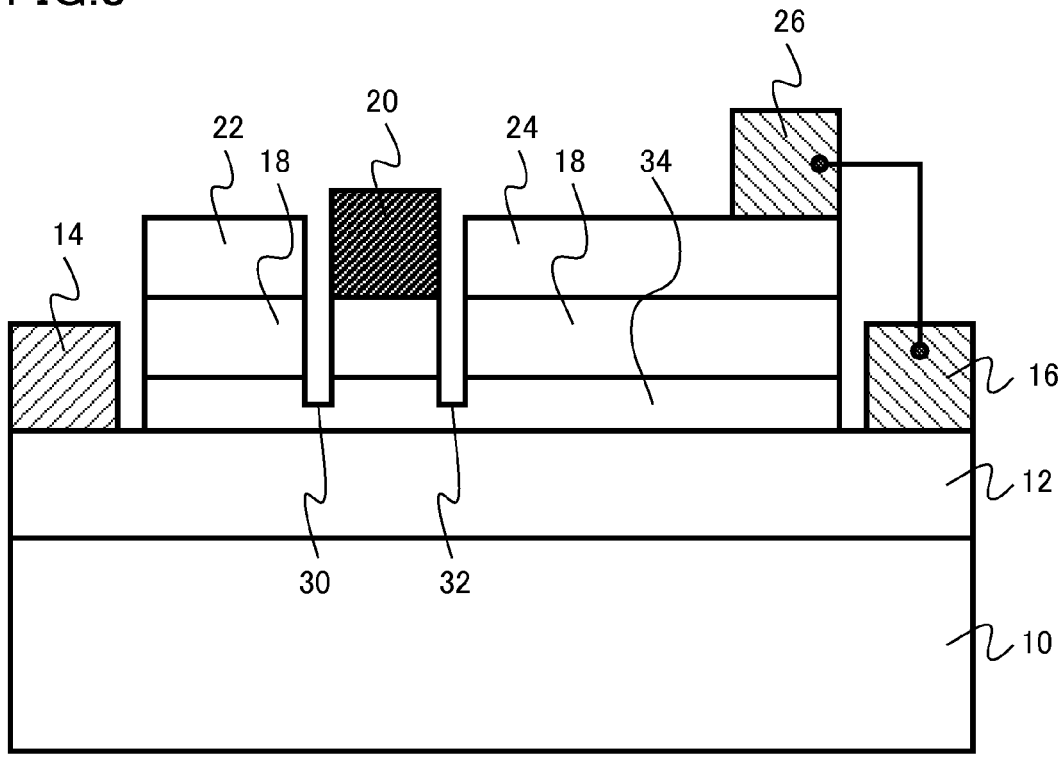
FIG. 8 is a schematic cross-sectional view of a semiconductor device as a second modification of the second embodiment.

FIG. 8 is a schematic cross-sectional view of a semiconductor device as a second modification of this embodiment. This modification differs from the first modification in that an i-type cap layer (a sixth semiconductor layer) 34 made of undoped $Al_WGa_{1-W}N$ (0≤W<1) is further formed between the barrier layer (the second semiconductor layer) 12 and the p-type cap layer (the third semiconductor layer) 18, and the bottom portions of the first groove 30 and the second groove 32 are located in the i-type cap layer (the sixth semiconductor layer) 34.

In this modification, exposure of the surface of the barrier layer 12 is prevented when the first groove 30 and the second groove 32 are formed by etching. Accordingly, trapping of carriers in the interface between the barrier layer 12 and the passivation film is suppressed. Thus, current collapses and reliability degradation are suppressed.

Third Embodiment

A semiconductor device of this embodiment differs from the first modification of the second embodiment in that the first electrode is connected to the portion of the third semiconductor layer located between the second groove and the second electrode. In the description below, explanation of the same aspects of those of the second embodiment will not be repeated.

Figure 9:
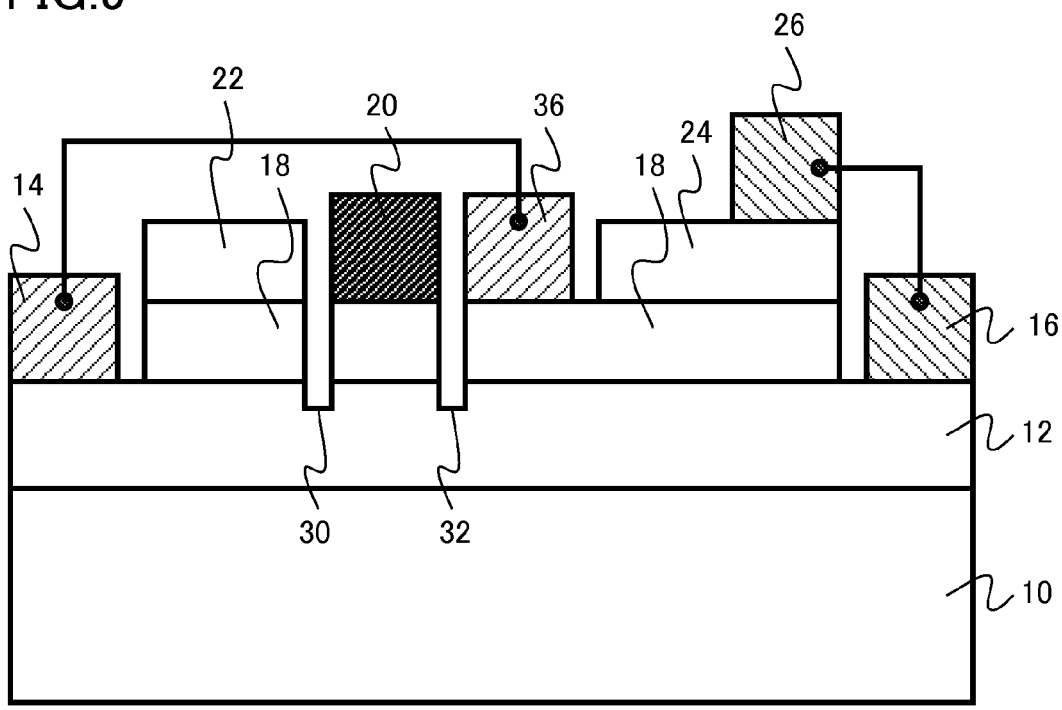
FIG. 9 is a schematic cross-sectional view of a semiconductor device of a third embodiment.

FIG. 9 is a schematic cross-sectional view of the semiconductor device of this embodiment. The semiconductor device of this embodiment is a HFET.

As shown in FIG. 9, the source electrode (the first electrode) 14 is electrically connected to the portion of the p-type cap layer (the third semiconductor layer) 18 located between the second groove 32 and the drain electrode (the second electrode) 16. Specifically, a strip-shaped electrode 36 is further provided on or above the p-type cap layer 18, for example, and the electrode 36 is electrically connected to the source electrode 14.

In this embodiment, the portion of the p-type cap layer 18 located between the gate electrode 20 and the drain electrode 16 is connected to the source electrode 14, so that holes that are generated in the p-type cap layer 18 when a high voltage is applied to the drain electrode 16 can be promptly discharged into the source electrode 14. Accordingly, even more stable switching operation can be realized.

The junction capacitance between the p-type cap layer 18 and the second n-type cap layer 24 is not gate-drain capacitance but gate-source capacitance. Accordingly, even higher-speed switching operation can be realized.

As described above, this embodiment provides a HFET that realizes normally-off operation, low on-state resistance, low power consumption, a current collapse reduction, and reliability improvement. This HFET further realizes even more stable and higher-speed switching operation.

(First Modification)

Figure 10:
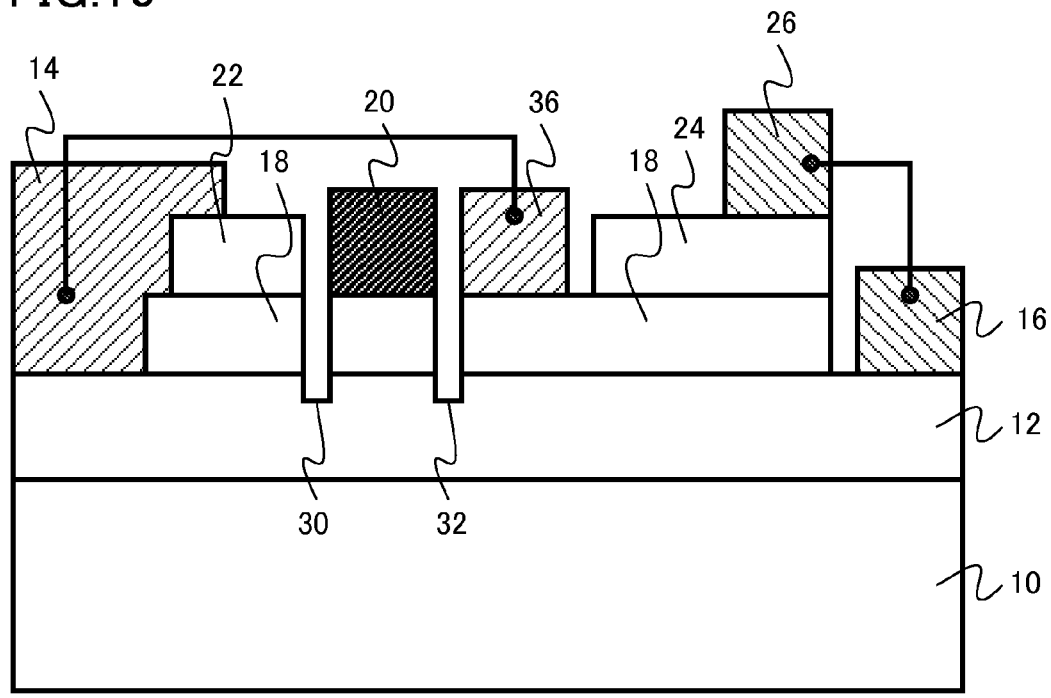
FIG. 10 is a schematic cross-sectional view of a semiconductor device as a first modification of the third embodiment.

FIG. 10 is a schematic cross-sectional view of a semiconductor device as a first modification of this embodiment. This modification differs from the third embodiment in that the source electrode (the first electrode) 14, the portion of the p-type cap layer (the third semiconductor layer) 18 located between the source electrode (the first electrode) 14 and the first groove 30, and the first n-type cap layer (the fourth semiconductor layer) 22 are electrically connected.

In this modification, carriers do not travel between the p-type cap layer 18 and the first n-type cap layer 22 when a gate voltage is applied to the gate electrode 20. Accordingly, even more stable switching operation can be realized.

(Second Modification)

Figure 11:
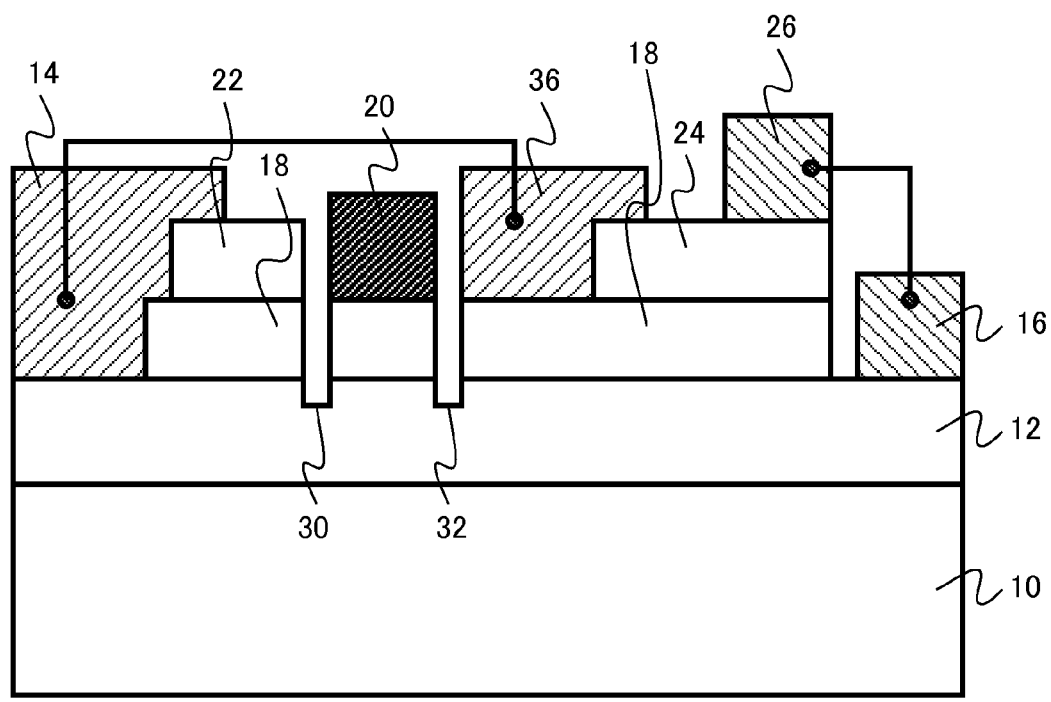
FIG. 11 is a schematic cross-sectional view of a semiconductor device as a second modification of the third embodiment.

FIG. 11 is a schematic cross-sectional view of a semiconductor device as a second modification of this embodiment. This modification differs from the first modification in that the source electrode (the first electrode) 14 and the second n-type cap layer (the fifth semiconductor layer) 24 are schottky-connected. Specifically, the electrode 36 that is connected to the source electrode 14 and is located on the second n-type cap layer 24 is schottky-connected to the second n-type cap layer 24.

In this modification, an internal body diode is provided between the source electrode 14 and the drain electrode 16. Accordingly, a highly-reliability HFET can be realized without preparation of an external body diode.

Fourth Embodiment

A semiconductor device of this embodiment is the same as the first modification of the third embodiment, except that the control electrode is placed so as to penetrate through a seventh semiconductor layer that is provided on or above the portion of the third semiconductor layer located between the first groove and the second groove, and has the same chemical composition as the fourth semiconductor layer and the fifth semiconductor layer, and through an interlayer insulating film provided on or above the seventh semiconductor layer. Therefore, explanation of the same aspects as those of the third embodiment will not be repeated below.

Figure 12:
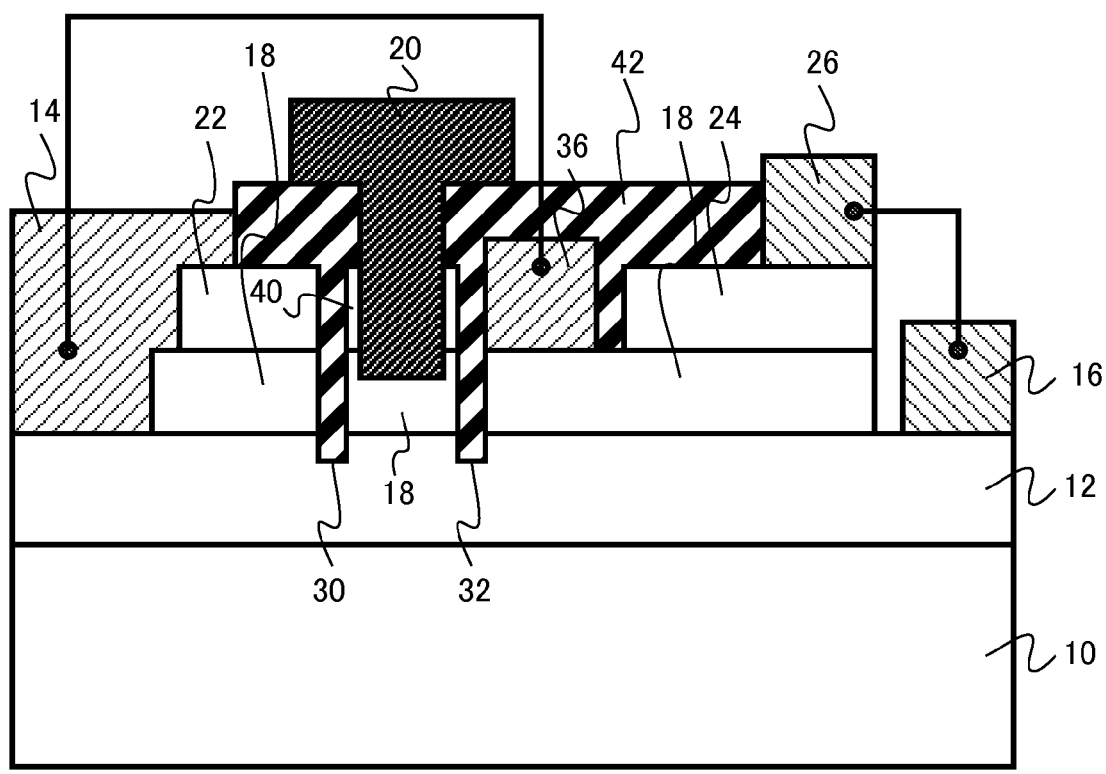
FIG. 12 is a schematic cross-sectional view of a semiconductor device of a fourth embodiment.

FIG. 12 is a schematic cross-sectional view of the semiconductor device of this embodiment. The semiconductor device of this embodiment is a HFET.

As shown in FIG. 12, a third n-type cap layer (the seventh semiconductor layer) 40 that has the same chemical composition as the first n-type cap layer (the fourth semiconductor layer) 22 and the second n-type cap layer (the fifth semiconductor layer) 24 is provided on or above the portion of the p-type cap layer 18 located between the first groove 30 and the second groove 32. An interlayer insulating film 42 is further provided on or above the third n-type cap layer 40. The interlayer insulating film 42 is a silicon oxide film, for example.

The gate electrode (the control electrode) 20 is placed so as to penetrate through the interlayer insulating film 42 and the third n-type cap layer 40, and come into contact with the p-type cap layer 18.

In this embodiment, the etching for forming the first groove 30 and the second groove 32 can be performed independently of the etching for forming the gate electrode 20. Accordingly, even if misalignment occurs at the time of the etching for forming the gate electrode 20, variation in the characteristics of the HFET can be suppressed.

As described above, this embodiment provides a HFET that realizes normally-off operation, low on-state resistance, low power consumption, a current collapse reduction, and reliability improvement. Furthermore, the HFET has smaller variation in characteristics.

(Modification)

Figure 13:
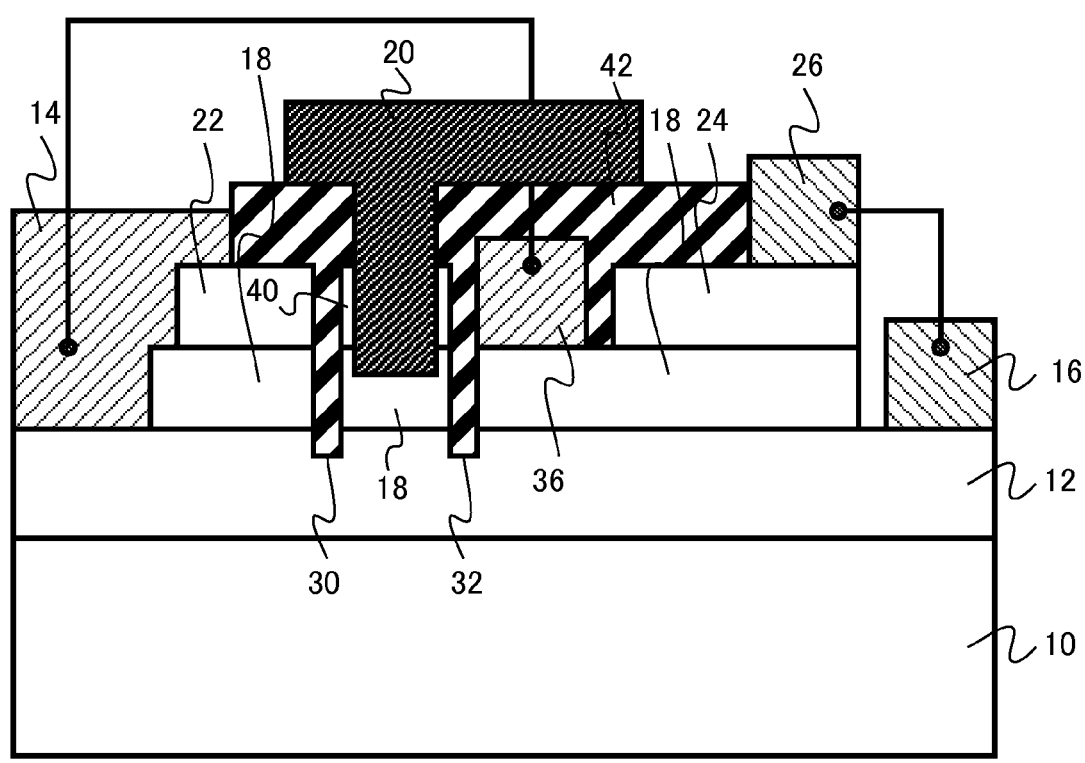
FIG. 13 is a schematic cross-sectional view of a semiconductor device as a modification of the fourth embodiment.

FIG. 13 is a schematic cross-sectional view of a semiconductor device of as a modification of this embodiment. This modification is the same as the fourth embodiment, except that the gate electrode (the control electrode) 20 on the interlayer insulating film 42 is wider on the side of the drain electrode (the second electrode) 16.

In this modification, electric field concentration at an edge portion of the p-type cap layer 18 is reduced by a field plate effect. Accordingly, breakdown voltage is increased, and a further current collapse reduction and ensuring of high reliability can be realized.

Although the example materials of the semiconductor layers are GaN and AlGaN in the above described embodiments, it is also possible to use InGaN, InAlN, and InAlGaN, which contain indium (In), for example. It is also possible to use AlN as the material of a semiconductor layer.

Although the barrier layer is an undoped AlGaN layer in the above described embodiments, it is also possible to use an n-type AlGaN layer.

Although the supporting substrate is a Si substrate in the above described embodiments, it is also possible to use a SiC substrate, a GaN substrate, or the like. Further, a buffer layer for relaxing lattice strain may be inserted between the supporting substrate and the channel layer.

While certain embodiments have been described, these embodiments have been presented by way of example only, and are not intended to limit the scope of the inventions. Indeed, semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor layer including $Al_XGa_{1-X}N$ ($0 \leq X < 1$);
   a second semiconductor layer provided above the first semiconductor layer, the second semiconductor layer including undoped or n-type $Al_YGa_{1-Y}N$ ($0 < Y \leq 1$, $X < Y$);
   a first electrode electrically connected to the second semiconductor layer;
   a second electrode electrically connected to the second semiconductor layer;
   a third semiconductor layer provided above a portion of the second semiconductor layer between the first electrode and the second electrode, the third semiconductor layer being separated from each of the first electrode and the second electrode, the third semiconductor layer including p-type $Al_ZGa_{1-Z}N$ ($0 \leq Z < 1$);

a control electrode electrically connected to the third semiconductor layer;

a fourth semiconductor layer provided above a portion of the third semiconductor layer between the first electrode and the control electrode, the fourth semiconductor layer being separated from the control electrode, the fourth semiconductor layer including n-type $Al_UGa_{1-U}N$ ($0 \leq U < 1$); and a fifth semiconductor layer provided above a portion of the third semiconductor layer between the control electrode and the second electrode, the fifth semiconductor layer being separated from the control electrode, the fifth semiconductor layer including n-type $Al_UGa_{1-U}N$ ($0 \leq U < 1$).

2. The device according to claim 1, wherein a sheet impurity concentration of an n-type impurity in the fourth and fifth semiconductor layers is higher than a sheet impurity concentration of a p-type impurity in the third semiconductor layer.

3. The device according to claim 1, wherein the fifth semiconductor layer is electrically connected to the second electrode.

4. The device according to claim 1, wherein the fourth semiconductor layer is electrically connected to the first electrode.

5. The device according to claim 1, wherein the fourth semiconductor layer is provided as an island-like form.

6. The device according to claim 3, wherein a sheet carrier concentration of a two-dimensional electron gas at an interface between the first semiconductor layer and the second semiconductor layer below the fifth semiconductor layer is lower than a sheet impurity concentration of a p-type impurity at the third semiconductor layer and a sheet impurity concentration of an n-type impurity at the fifth semiconductor layer.

* * * * *